United States Patent [19]

Wen et al.

[11] Patent Number: 5,087,896
[45] Date of Patent: Feb. 11, 1992

[54] FLIP-CHIP MMIC OSCILLATOR ASSEMBLY WITH OFF-CHIP COPLANAR WAVEGUIDE RESONANT INDUCTOR

[75] Inventors: Cheng P. Wen, Mission Viejo; Gregory S. Mendolia, Torrance; Mario Siracusa, Fountain Valley, all of Calif.; Joseph J. Maieron, Kokomo; William D. Higdon, Greentown, both of Ind.

[73] Assignees: Hughes Aircraft Company, Los Angeles, Calif.; Delco Electronics Corporation, Kokomo, Ind.

[21] Appl. No.: 641,954

[22] Filed: Jan. 16, 1991

[51] Int. Cl.$^5$ ............................ H03B 5/18; H01P 3/08
[52] U.S. Cl. ........................................ 331/99; 29/593;
331/108 D; 331/117 D; 331/117 FE; 333/246;
333/247; 336/200
[58] Field of Search .............. 331/96, 99, 107 SL,
331/117 D, 117 FE, 108 C, 108 D;
333/220-223, 238, 246, 247; 336/200; 29/593

[56] References Cited

U.S. PATENT DOCUMENTS 4,998,077  3/1991  Nanni et al. .............. 331/107 SL X Primary Examiner—Siegfried H. Grimm
Attorney, Agent, or Firm—Jeannette M. Walder; Terje Gudmestad; W. Denson-Low

[57] ABSTRACT

A coplanar waveguide based microwave monolithic integrated circuit (MMIC) oscillator chip (14) having an active oscillator element (16) and a resonant capacitor (18) formed thereon is flip-chip mounted on a dielectric substrate (12). A resonant inductor (22) is formed on the substrate (12) and interconnected with the resonant capacitor (18) to form a high Q-factor resonant circuit for the oscillator (10). The resonant inductor (22) includes a shorted coplanar waveguide section (24) consisting of first and second ground strips (24b,24c), and a conductor strip (24a) extending between the first and second ground strips (24b,24c) in parallel relation thereto and being separated therefrom by first and second spaces (26a,26b) respectively. A shorting strip (24d) electrically interconnects adjacent ends of the conductor strip (24a) and first and second ground strips (24b,24c) respectively. A dielectric film (34) may be formed over at least adjacent portions of the conductor strip (24a) and first and second ground strips (24b,24c). The resonant inductor (22) is adjusted to provide a predetermined resonant frequency for the oscillator (10) by using a laser (40) to remove part of the dielectric film (34) in the first and second spaces (26a,26b) for fine adjustment, and/or to remove part of the shorting strip (24d) at the ends of the first and second spaces (26a,26b) for coarse adjustment.

26 Claims, 2 Drawing Sheets

FLIP-CHIP MMIC OSCILLATOR ASSEMBLY WITH OFF-CHIP COPLANAR WAVEGUIDE RESONANT INDUCTOR

BACKGROUND OF THE INVENTION

1. Field of the Invention

The present invention relates to a flip-chip microwave monolithic integrated circuit (MMIC) oscillator or signal source assembly including a resonant inductor in the form of a shorted coplanar waveguide section provided external of the MMIC chip.

2. Description of the Related Art

Radar transceivers incorporating MMIC integrated circuit oscillators and other components are desirable in numerous applications, including near obstacle detection systems (NODS), true ground speed sensors, obstacle avoidance systems (adaptive cruise control), and active phased array radars which utilize a large number of transceivers in a single operating unit. A general treatise on MMIC technology and microwave transmission line configurations is found in "Millimeter-Wave Integrated Circuits", by Kai Chang, TRW Electronics & Defense Sector/Quest, Winter 1983/84, pp. 43-59.

Stringent Federal Communications Regulations of frequency allocation place severe restrictions on the operating bandwidth of radar sensors and microwave communications systems. Conventional MMIC oscillators are generally based on a microstrip architecture, with a relatively large gap between the conductor strips on one side of the substrates and the ground planes on the other side. This gap is conducive to the generation of spurious RF radiation which can exceed the federal standards. In addition, MMIC oscillators often exhibit high phase noise and poor thermal stability because of the relatively low Q-factor of the circuit elements formed on the chips. Frequency locking or complex temperature compensation schemes are often required to achieve acceptable frequency stability or adequate phase noise performance from MMIC oscillators for RF signal generation. An example of such a single chip MMIC oscillator is described in an article entitled "OPTIMIZED X & KU BAND GaAs MMIC VARACTOR TUNED FET OSCILLATORS", by E. Reese et al, in 1988 IEEE MTT-S Digest, pp. 487-490.

An external high Q-factor dielectric resonator is frequently employed to improve the frequency stability characteristics. Replacing the inherently low Q-factor MMIC oscillator resonant circuit elements with an external (off-chip) higher Q-factor dielectric element reduces both the ambient temperature dependance and the phase noise. An example of such an arrangement is found in an article entitled "A BROADBAND VCO USING DIELECTRIC RESONATORS", by P. Kandpal et al, in 1988 IEEE MTT-S Digest, pp. 609-612.

Placement of the external dielectric resonator or "puck" is extremely critical because both the tuning characteristics of the oscillator and the oscillator frequency depend on the coupling and loaded Q-factor of the resonator. Assembly of a dielectric resonator stabilized oscillator requires that the resonator be coupled tightly enough to the MMIC chip by placing it close to the circuit. An external metallic tuner in the form of a screw is employed to adjust the resonator frequency, because it is practically impossible to fabricate many dielectric resonators with identical resonant frequency.

The screw tuning method provides little control of the loaded Q-factor of the oscillator tank circuit, resulting in non-uniform frequency modulation characteristics if the oscillator is employed as a voltage controlled signal source. Mechanical adjustment of the oscillation frequency is labor intensive. Any vibration which changes the gap between the tuning screw and the dielectric puck will produce a fluctuation in oscillation frequency. Despite the high Q-factor of the dielectric resonator arrangement, it is not easily adaptable to low cost, high volume MMIC based microwave module production.

SUMMARY OF THE INVENTION

The present invention provides an arrangement for precisely adjusting the oscillation frequency in a MMIC oscillator or signal source circuit without recourse to mechanical tuning screws such as are required in prior art dielectric resonator configurations, while providing a resonant circuit with a high and stable Q-factor. In addition, the coplanar waveguide architecture of the present oscillator assembly greatly reduces the level of spurious RF radiation compared to prior art microstrip based MMIC oscillators due to the relatively small gaps between the center conductors and ground strips which are on the same side of the substrate.

In accordance with the present invention, a coplanar waveguide based MMIC oscillator chip including an active oscillator element and a resonant capacitance element formed thereon is flip-chip mounted on a dielectric substrate. A resonant inductor is formed on the substrate and interconnected with the resonant capacitance element to form a high Q-factor resonant circuit for the oscillator. The resonant inductor includes a shorted coplanar waveguide section consisting of first and second ground strips, and a conductor strip extending between the first and second ground strips in parallel relation thereto and being separated therefrom by first and second spaces respectively. A shorting strip electrically interconnects adjacent ends of the conductor strip and first and second ground strips respectively. A dielectric film may be formed over at least adjacent portions of the conductor strip and first and second ground strips. The resonant inductor is adjusted to provide a predetermined resonant frequency for the oscillator by using a laser to remove part of the dielectric film in the first and second spaces for fine adjustment, and/or to remove part of the shorting strip at the ends of the first and second spaces for coarse adjustment.

The Q-factor of a shorted coplanar waveguide section which is designed to function as an inductor is proportional to the width of the center conductor strip thereof. Severe space limitations in the design of MMIC chips limits the width of the center conductor to approximately 25 micrometers. Providing the inductor external of the MMIC chip greatly reduces the space limitations and enables the center conductor to be made much thicker, on the order of 400 micrometers, thereby increasing the Q-factor of the oscillator circuit by an order of magnitude.

These and other features and advantages of the present invention will be apparent to those skilled in the art from the following detailed description, taken together with the accompanying drawings, in which like reference numerals refer to like parts.

DETAILED DESCRIPTION OF THE INVENTION

Figure 1:
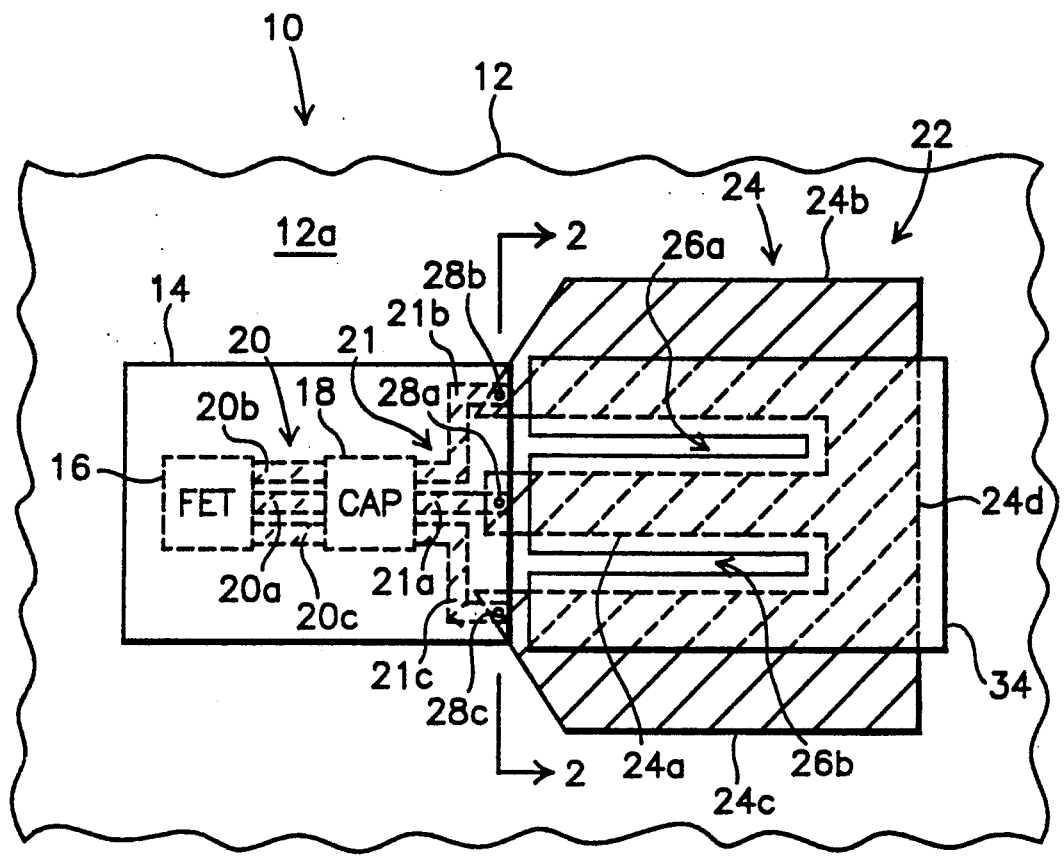
FIG. 1 is simplified plan view illustrating a MMIC oscillator assembly embodying the present invention.
Figure 2:
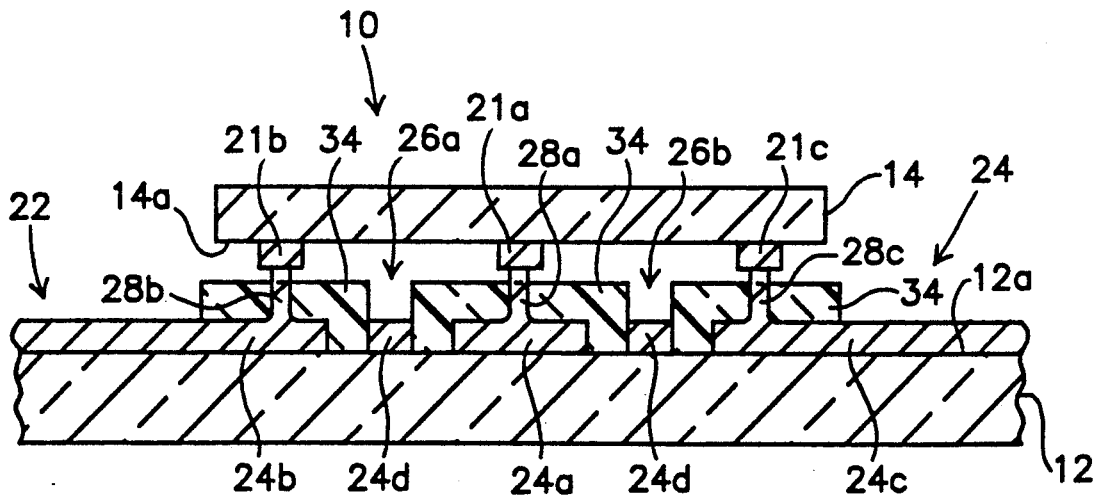
FIG. 2 is a sectional view taken on a line 2—2 of FIG. 1.

Referring now to FIGS. 1 and 2 of the drawing, a MMIC oscillator or signal source assembly embodying the present invention is generally designated as 10, and includes a dielectric substrate 12 formed of a ceramic or other electrically insulative material. A MMIC integrated circuit chip 14 is mounted on the substrate 12 in a flip-chip arrangement.

The chip 14 has an active oscillator element such as a field effect transistor (FET) 16, and a capacitance element such as a capacitor 18 formed thereon. It will be understood that the active and capacitance elements may be replaced with other elements which provide similar electrical operation within the scope of the invention. For example, the FET 16 and capacitor 18 may be replaced by a bipolar transistor and a variable capacitance diode respectively, although not specifically illustrated.

Various additional elements or components in addition to the active and capacitance elements will be formed on the chip 14 in an actual oscillator assembly, although they are not the subject matter of the present invention and are not shown in the drawing. However, the MMIC chip 14 is preferably fabricated with a coplanar waveguide architecture, in which all of the components and interconnections are formed on a single surface or side 14a of the chip 14 which faces the substrate 12 when the chip 14 is mounted thereon in the flip-chip configuration. The components are interconnected by coplanar waveguide sections, each including a center conductor strip, and two ground strips which are spaced from and extend in parallel relation to the conductor strip on opposite sides thereof. The conductor and ground strips are formed of gold, silver, aluminum, or other suitable electrically conductive material.

The FET 16 and capacitor 18 are illustrated as being interconnected by a coplanar waveguide section 20 including a center conductor strip 20a and ground strips 20b and 20c. A coplanar waveguide section 21 including a conductor strip 21a and ground strips 21b and 21c leads from the capacitor 18 for external connection to an off-chip resonant inductor 22.

In accordance with the present invention, the resonant inductor 22 is formed on a surface or side 12a of the substrate on which the chip 14 is mounted. The inductor 22 includes a shorted coplanar waveguide section 24 including a center conductor strip 24a, first and second ground strips 24b and 24c, and a shorting strip 24d. The ground strips 24b and 24c extend in parallel relation to the conductor strip 24a, and define spaces 26a and 26b therebetween. The shorting strip 24d interconnects the adjacent right ends of the strips 24a, 24b and 24c of the waveguide section 24 as viewed in FIG. 1, thereby electrically connecting or shorting the right end of the conductor strip 24a to the right ends of the ground strips 24b and 24c.

As viewed in FIG. 1, the right ends of the strips 21a, 21b and 21c on the chip 14 are interconnected with the left ends of the strips 24a, 24b and 24c on the substrate 12 respectively, thereby electrically interconnecting the capacitor 18 and the waveguide section 24. As best seen in FIG. 2, the interconnection is facilitated by electrically conductive bumps 28a, 28b and 28c which are formed on the strips 24a, 24b and 24c, and soldered or welded to the strips 21a, 21b and 21c respectively. The bumps 28a, 28b and 28c further serve to space the surface 14a of the chip 14 from the adjacent surface 12a of the substrate 12. It is within the scope of the invention to form the bumps on the strips of the chip 14, rather than on the strips of the substrate 12, although not specifically illustrated.

Figure 3:
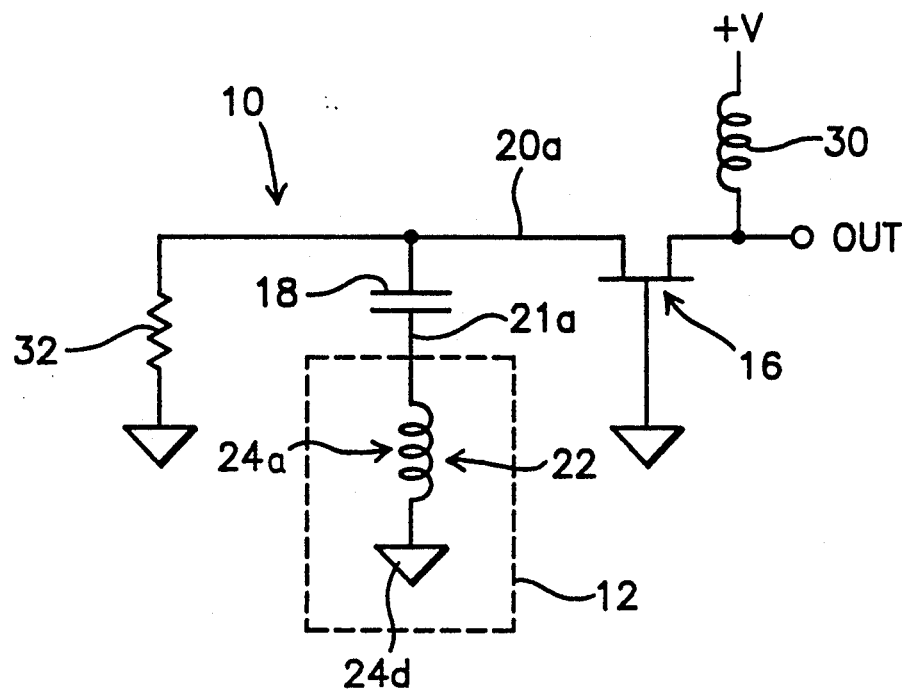
FIG. 3 is an electrical schematic diagram of the oscillator assembly.

A simplified electrical schematic diagram of the oscillator assembly 10 is illustrated in FIG. 3. The capacitor 18 and inductor 22 are connected in series between the FET 16 and ground to constitute a series resonant circuit for the oscillator assembly 10. A DC voltage +V is applied to the FET 16 through a coupling element such as an inductor 30. Further illustrated is a terminating resistor 32 connected between the FET 16 and ground. The oscillator assembly 10 produces a microwave frequency electrical output signal OUT at the junction of the FET 16 and inductor 30.

Although a particular exemplary oscillator arrangement is illustrated in FIG. 3, it will be understood that the present invention is not so limited, and is applicable to a wide variety of oscillator arrangements for generating signals at microwave or higher frequencies.

The shorted coplanar waveguide section 24 constitutes an inductor at microwave frequencies where the length of the conductor strip 24a is less than $\frac{1}{4}$ of the wavelength corresponding to the resonant frequency of the oscillator assembly 10. It will be understood, however, that the Q-factor of the waveguide section 24 may be increased by adding multiples of $\frac{1}{2}$ wavelength to the length of the center conductor 24a, if sufficient space is available on the substrate 12. The inductance of the inductor 22 increases in proportion to the length of the conductor strip 24a in a well known manner. As a representative example, for an oscillation frequency of 10.6 GHz and a characteristic impedance of 50 ohms, the conductor strip 24a will be on the order of 1016 micrometers long and 381 micrometers wide, with the spaces 26a and 26b between the conductor strip 24a and ground strips 24b and 24c being 127 micrometers wide.

The shorted waveguide section 24 formed on the substrate 12 may be made over an order of magnitude larger, have a much larger Q-factor, and be much more advantageously adjusted to a precise value of inductance than an inductor formed on a MMIC chip as will be described below.

Although the inductor 22 may be constituted by the shorted coplanar waveguide section 24 alone, a dielectric film 34 is preferably formed over at least part of the waveguide section 24 to enable fine adjustment of the inductance thereof and thereby the resonant frequency of the oscillator assembly 10. The dielectric film 34 may be formed of a suitable material such as $SiO_2$ or $Si_3N_4$, and may or may not be coextensive with the waveguide section 24. However, the film 34 should extend from the conductor strip 24a and the ground strips 24b and 24c at least partially into the first and second spaces 26a and 26b. The portions of the film 34 in the spaces 26a and 26b increase the capacitance between the conductor strip 24a and ground strips 24b and 24c, thereby reducing the net inductance of the inductor 22.

Figure 4:
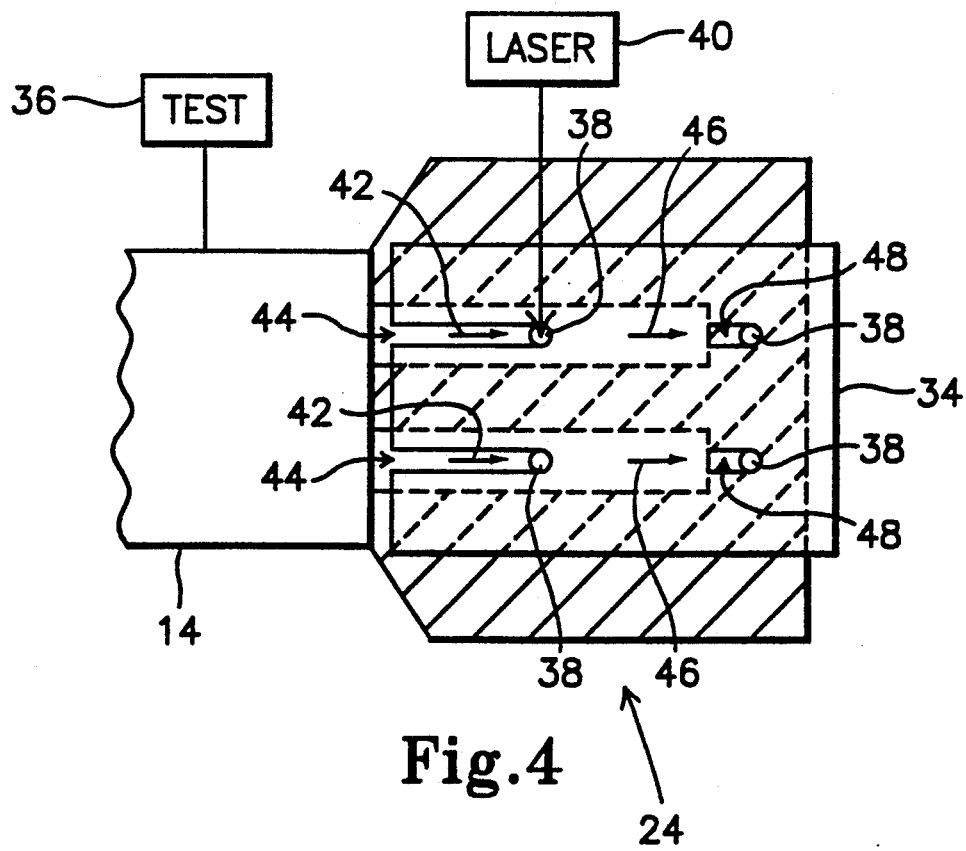
FIG. 4 is a simplified plan view illustrating a method of fabricating the present MMIC oscillator assembly in accordance with the present invention.

As symbolically illustrated in FIG. 4, a suitable test instrument 36 is connected to the chip 14 to supply the DC power +V and sense or measure the resonant frequency of the oscillator assembly 10. Where the dielectric film 34 is formed over the waveguide section 24 including the spaces 26a and 26b, the inductor 22 is designed such that the inductance thereof is initially lower than a predetermined design value, and the resonant frequency is initially higher than a corresponding predetermined design value. A beam 38 from a laser 40 is then used to ablate away or remove an incremental part of the film 34 in at least one of the spaces 26a. The laser beam 38 may be moved rightwardly from the left edge of the film 34 as illustrated by arrows 42 to form cuts 44, or in any other desired pattern.

The resonant frequency of the oscillator assembly 10 is monitored by the test instrument 36 in a continuous or incremental manner, and the laser ablation is terminated when the sensed oscillator frequency has been reduced to the predetermined design value.

It is further within the scope of the present invention to use the laser 40 to remove part of the shorting strip 24d at the ends of the spaces 26a and 26b. This has the effect of increasing the effective length of the conductor strip 24a, and increasing the inductance of the inductor 22. In this case, the laser beam 38 is preferably moved rightwardly from the left edge of the shorting strip 24d as indicated by arrows 46 to form cuts 48.

The cuts 44 and 48 may have widths substantially equal to the widths of the spaces 26a and 26b, or may be narrower than the spaces 26a and 26b as illustrated in FIG. 4.

Removal of material from the shorting strip 24d provides a coarser adjustment than removal of material from the dielectric film 34, and may be performed whether or not the dielectric film 34 is included in the design of the inductor 22 for a particular application. It will be understood that although the laser 40 constitutes a preferred means for material removal and adjustment of the oscillator frequency, the invention is not so limited, and any other material removal method which provides the desired results, for example mechanical diamond scribing, may alternatively be employed.

While several illustrative embodiments of the invention have been shown and described, numerous variations and alternate embodiments will occur to those skilled in the art, without departing from the spirit and scope of the invention. Accordingly, it is intended that the present invention not be limited solely to the specifically described illustrative embodiments. Various modifications are contemplated and can be made without departing from the spirit and scope of the invention as defined by the appended claims.

We claim:

1. A microwave frequency resonant circuit assembly, comprising:
   an electrically insulative substrate;
   an integrated circuit chip mounted on the substrate;
   capacitor means formed on the chip;
   inductor means including a shorted coplanar waveguide section formed on the substrate; and
   electrical connector means interconnecting the capacitor means and the inductor means to form a resonant circuit.

2. An assembly as in claim 1, in which the connector means interconnects the capacitor means and the inductor means to form a series resonant circuit.

3. An assembly as in claim 1, in which the shorted coplanar waveguide section comprises:
   first and second ground strips;
   a conductor strip extending between the first and second ground strips in parallel relation thereto and being separated therefrom by first and second spaces respectively; and
   a shorting strip for electrically interconnecting adjacent first ends of the conductor strip and first and second ground strips respectively;
   the electrical connector means being connected to second ends of the conductor strip and first and second ground strips respectively.

4. An assembly as in claim 3, in which the inductor means further comprises a dielectric film formed over at least adjacent portions of the conductor strip and first and second ground strips.

5. An assembly as in claim 4, in which the dielectric film extends from the conductor strip and the first and second ground strips at least partially into the first and second spaces.

6. An assembly as in claim 1, in which:
   the capacitor means is formed on a surface of the chip which faces the substrate; and
   the inductor means is formed on a surface of the substrate which faces the chip.

7. An assembly as in claim 6, in which the interconnection means comprises coplanar waveguide means formed on said surface of the chip.

8. A microwave monolithic integrated circuit (MMIC) oscillator assembly, comprising:
   an electrically insulative substrate;
   a MMIC chip which is flip-chip mounted on the substrate and includes:
      active oscillator element means;
      resonant capacitor means; and
      coplanar waveguide means interconnecting the active oscillator element means and resonant capacitor means;
   resonant inductor means including a shorted coplanar waveguide section formed on the substrate; and
   electrical connector means interconnecting the resonant capacitor means and resonant inductor means to form a resonant circuit of the oscillator assembly.

9. An assembly as in claim 8, in which the connector means interconnects the capacitor means and inductor means to form a series resonant circuit.

10. An assembly as in claim 8, in which the shorted coplanar waveguide section comprises:
    first and second ground strips;
    a conductor strip extending between the first and second ground strips in parallel relation thereto and being separated therefrom by first and second spaces respectively; and
    a shorting strip for electrically interconnecting adjacent first ends of the conductor strip and first and second ground strips respectively;
    the electrical connector means being connected to second ends of the conductor strip and first and second ground strips respectively.

11. An assembly as in claim 10, in which the inductor means further comprises a dielectric film formed over at least adjacent portions of the conductor strip and first and second ground strips.

12. An assembly as in claim 11, in which the dielectric film extends from the conductor strip and the first and second ground strips at least partially into the first and second spaces.

13. A method of fabricating a microwave frequency inductor on an electrically insulative substrate, comprising the steps of:
   (a) forming a shorted coplanar waveguide section on the substrate, the waveguide section including first and second ground strips, a conductor strip extending between the first and second ground strips in parallel relation thereto and being separated therefrom by first and second spaces respectively, and a shorting strip for electrically interconnecting adjacent first ends of the conductor strip and first and second ground strips respectively;
   (b) forming a dielectric film over at least adjacent portions of the conductor strip and first and second ground strips;
   (c) sensing the inductance of the waveguide section;
   (d) removing part of the dielectric film from at least one of the first and second spaces; and
   (e) repeating steps (c) and (d) until the sensed inductance is substantially equal to a predetermined value.

14. A method as in claim 13, in which step (d) comprises using a laser to remove said part of the dielectric film.

15. A method of fabricating a microwave frequency inductor on an electrically insulative substrate, comprising the steps of:
   (a) forming a shorted coplanar waveguide section on the substrate, the waveguide section including first and second ground strips, a conductor strip extending between the first and second ground strips in parallel relation thereto and being separated therefrom by first and second spaces respectively, and a shorting strip for electrically interconnecting adjacent first ends of the conductor strip and first and second ground strips respectively;
   (b) sensing the inductance of the waveguide section;
   (c) removing part of the shorting strip at the first end of at least one of the first and second spaces respectively; and
   (d) repeating steps (b) and (c) until the sensed inductance is substantially equal to a predetermined value.

16. A method as in claim 15, in which step (c) comprises using a laser to remove said part of the shorting strip.

17. A method as in claim 15, further comprising the step, performed before step (b), of:
   (e) forming a dielectric film over at least adjacent portions of the conductor strip and first and second ground strips.

18. A method as in claim 17, further comprising the steps, performed after step (e), of:
   (f) sensing the inductance of the waveguide section;
   (g) removing part of the dielectric film from at least one of the first and second spaces; and
   (h) repeating steps (f) and (g) until the sensed inductance is substantially equal to the predetermined value.

19. A method as in claim 18, in which step (g) comprises using a laser to remove said part of the dielectric film.

20. A method of fabricating a microwave monolithic integrated (MMIC) oscillator assembly, comprising the steps of:
   (a) providing an electrically insulative substrate;
   (b) fabricating a MMIC chip including active oscillator element means, resonant capacitor means, and coplanar waveguide means interconnecting the active oscillator element means and resonant capacitor means;
   (c) forming resonant inductor means including a shorted coplanar waveguide section on the substrate, the waveguide section including first and second ground strips; a conductor strip extending between the first and second ground strips in parallel relation thereto and being separated therefrom by first and second spaces respectively; and a shorting strip for electrically interconnecting adjacent first ends of the conductor strip and first and second ground strips respectively;
   (d) forming a dielectric film over at least adjacent portions of the conductor strip and first and second ground strips;
   (e) flip-chip mounting the MMIC chip on the substrate such that the resonant capacitor means and resonant inductor means are interconnected to form a resonant circuit of the oscillator assembly;
   (f) sensing the oscillation frequency of the resonant circuit;
   (g) removing part of the dielectric film from at least one of the first and second spaces; and
   (h) repeating steps (f) and (g) until the sensed oscillation frequency is substantially equal to a predetermined value.

21. A method as in claim 20, in which step (g) comprises using a laser to remove said part of the dielectric film.

22. A method of fabricating a microwave monolithic integrated (MMIC) oscillator assembly, comprising the steps of:
   (a) providing an electrically insulative substrate;
   (b) fabricating a MMIC chip including active oscillator element means, resonant capacitor means, and coplanar waveguide means interconnecting the active oscillator element means and resonant capacitor means;
   (c) forming resonant inductor means including a shorted coplanar waveguide section on the substrate, the waveguide section including first and second ground strips, a conductor strip extending between the first and second ground strips in parallel relation thereto and being separated therefrom by first and second spaces respectively, and a shorting strip for electrically interconnecting adjacent first ends of the conductor strip and first and second ground strips respectively;
   (d) flip-chip mounting the MMIC chip on the substrate such that the resonant capacitor means and resonant inductor means are interconnected to form a resonant circuit of the oscillator assembly;
   (e) sensing the oscillation frequency of the resonant circuit;
   (f) removing part of the shorting strip at the first end of at least one of the first and second spaces respectively; and
   (g) repeating steps (e) and (f) until the sensed oscillation frequency is substantially equal to a predetermined value.

23. A method as in claim 22, in which step (f) comprises using a laser to remove said part of the shorting strip.

24. A method as in claim 22, further comprising the step, performed before step (e), of:
(h) forming a dielectric film over at least adjacent portions of the conductor strip and first and second ground strips.

25. A method as in claim 24, further comprising the steps, performed after step (h), of:
(i) sensing the oscillation frequency of the resonant circuit;
(j) removing part of the dielectric film from at least one of the first and second spaces; and
(k) repeating steps (i) and (j) until the sensed oscillation frequency is substantially equal to the predetermined value.

26. A method as in claim 25, in which (j) comprises using a laser to remove said part of the dielectric film.

* * * * *